(12) United States Patent
Hatashita et al.

(10) Patent No.: US 8,598,049 B2
(45) Date of Patent: Dec. 3, 2013

(54) DEPOSITION METHOD (75) Inventors: Masayasu Hatashita, Hyogo (JP);
Akimitsu Oishi, Hyogo (JP); Shoichi Murakami, Hyogo (JP)

(73) Assignee: SecureView LLC, Cleveland, OH (US)

( * ) Notice: Subject to any disclaimer, the term of this patent is extended or adjusted under 35 U.S.C. 154(b) by 0 days.

(21) Appl. No.: 13/517,193

(22) PCT Filed: Nov. 25, 2010

(86) PCT No.: PCT/JP2010/070971
§ 371 (c)(1),
(2), (4) Date: Jun. 19, 2012

(87) PCT Pub. No.: WO2011/114581
PCT Pub. Date: Sep. 22, 2011

(65) Prior Publication Data
US 2012/0258604 A1  Oct. 11, 2012

(30) Foreign Application Priority Data
Mar. 17, 2010  (JP) .................. 2010-060091

(51) Int. Cl.
*H01L 21/762* (2006.01)
*H01L 21/768* (2006.01)

(52) U.S. Cl.
USPC ............ 438/778; 438/770; 257/E21.24

(58) Field of Classification Search
CPC ............ H01L 21/76831; H01L 21/76834; H01L 21/76224
USPC ........ 438/770, 778, 265, 758, 787, 788, 789, 438/790, 503, 680; 257/E21.17, E21.585, 257/E21.04; 118/722, 728, 725
See application file for complete search history.

(56) References Cited

U.S. PATENT DOCUMENTS 5,182,221 A * 1/1993 Sato ........................ 438/424
5,290,358 A * 3/1994 Rubloff et al. .......... 118/715

(Continued)

FOREIGN PATENT DOCUMENTS

CN   101050523 A   10/2007
JP   2000-150646 A   5/2000

(Continued)

OTHER PUBLICATIONS

D. S. Miles, "A Comparison of Film Quality and Step Coverage for Silicon Dioxide Dielectrics Formed by RTCVD Using Tetraethoxysilane and Silane", MRS Proceedings, vol. 338, 1994, pp. 338-343.*

*Primary Examiner* — Jarrett Stark
*Assistant Examiner* — Bitew Dinke
(74) *Attorney, Agent, or Firm* — Miller, Matthias & Hull LLP (57) ABSTRACT

A deposition method capable of forming an oxide film with a predetermined film thickness ratio using a deposition gas with which a small film thickness ratio is obtained and a deposition gas with which a large film thickness ratio is obtained. When forming an oxide film having a larger film thickness on the surface of a substrate than on the bottom surface of the hole so that the film thickness ratio of the oxide film formed on the surface of the substrate to the oxide film formed on the bottom surface of the hole becomes a predetermined ratio, plasma is generated from a gas mixture including tetraethoxysilane and oxygen to form an oxide film and then plasma is generated from a gas mixture including silane and nitrous oxide.

1 Claim, 7 Drawing Sheets

(56) References Cited

U.S. PATENT DOCUMENTS

| | | | |
|---|---|---|---|
| 5,314,845 A * | 5/1994 | Lee et al. | 438/763 |
| 5,420,065 A * | 5/1995 | Philipossian | 438/424 |
| 5,643,838 A * | 7/1997 | Dean et al. | 438/789 |
| 5,880,518 A * | 3/1999 | Oda et al. | 257/635 |
| 6,235,608 B1 * | 5/2001 | Lin et al. | 438/424 |
| 6,297,175 B1 * | 10/2001 | Iyer | 438/787 |
| 6,716,752 B2 * | 4/2004 | Kim et al. | 438/680 |
| 7,208,425 B2 * | 4/2007 | Ingle et al. | 438/763 |
| 7,378,304 B2 * | 5/2008 | Kim et al. | 438/151 |
| 7,994,019 B1 * | 8/2011 | Kweskin et al. | 438/437 |
| 2001/0042868 A1 * | 11/2001 | Hu | 257/200 |
| 2002/0137334 A1 * | 9/2002 | Watanabe et al. | 438/677 |
| 2002/0168855 A1 * | 11/2002 | Smythe et al. | 438/680 |
| 2004/0115898 A1 | 6/2004 | Moghadam et al. | |
| 2006/0099780 A1 * | 5/2006 | Yamazaki et al. | 438/487 |
| 2008/0032482 A1 * | 2/2008 | Tsai et al. | 438/424 |
| 2008/0166880 A1 * | 7/2008 | Levy | 438/758 |
| 2008/0166888 A1 | 7/2008 | Hsu et al. | |
| 2010/0261355 A1 * | 10/2010 | Ahn et al. | 438/787 |

FOREIGN PATENT DOCUMENTS

| | | |
|---|---|---|
| JP | 2008-244490 A | 10/2008 |
| JP | 2009-004397 A | 1/2009 |

\* cited by examiner

DEPOSITION METHOD

CROSS-REFERENCE TO RELATED APPLICATIONS

This application is a U.S. National Stage filing under 35 USC §371 of International Patent Application No. PCT/JP2010/070971 filed on Nov. 25, 2010, which claims priority under the Paris Convention to Japanese Application No. 2010-060091, filed on Mar. 17, 2010.

FIELD OF THE DISCLOSURE

The present invention relates to a deposition method of generating plasma from a deposition gas and forming an oxide film on the surface of a substrate including the side walls and the bottom surface of a hole or trench, and more specifically, relates to a deposition method of forming, on the surface of a substrate excluding the side walls and the bottom surface of a hole or trench, an oxide film having a film thickness larger than that of an oxide film formed on the bottom surface of the hole or trench.

BACKGROUND OF THE DISCLOSURE

Figure 5:
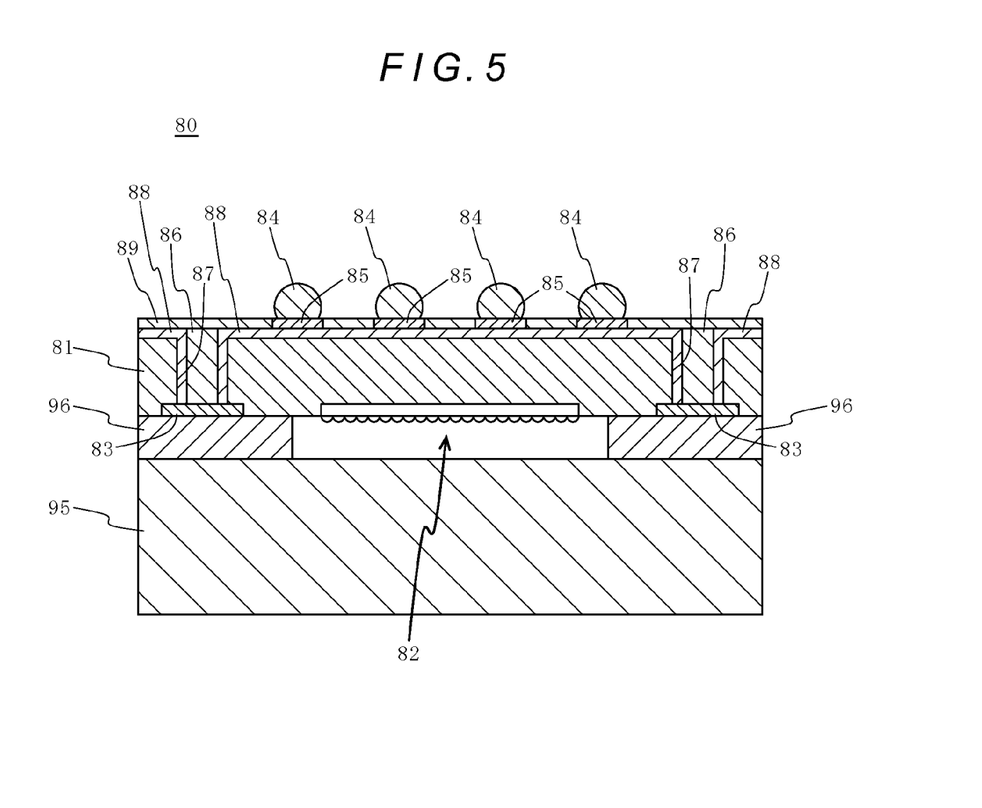
FIG. 5 is a sectional view showing an example of a semiconductor device.

In the field of semiconductor devices, devices have been made more and more compact and thinner and thinner, and as such a semiconductor device, there is a device as shown in FIG. 5, for example. FIG. 5 shows an image sensor 80 as an example of a semiconductor device, and this image sensor 80 has a configuration in which the underside of a silicon substrate 81 and the top surface of a glass substrate 95 are bonded together by an adhesive 96.

The underside of the silicon substrate 81 has an image capturing section 82 and pad electrodes 83 electrically connected to the image capturing section 82 formed therein, and the surface thereof has connecting terminals 84 and wiring films 85 electrically connected to the connecting terminals 84 formed therein. Further, the silicon substrate 81 has through electrodes 86 formed therein, the through electrodes 86 connecting the pad electrodes 83 and the wiring films 85 electrically.

The through electrodes 86 are formed by filling holes 87, which are formed in the surface of the silicon substrate 81 so that the top surfaces of the pad electrodes 83 are exposed, with an electrically conductive material, and an oxide film (insulation film) 88 is formed between the inner peripheral surfaces of the holes 87 and the outer peripheral surfaces of the through electrodes 86 and on the surface of the substrate 81 excluding the portions of the holes 87. Further, on the oxide film 88, the wiring films 85 and a passivation film 89 are formed.

In this image sensor 80, a series of processings for forming the through electrodes 86 in the silicon substrate 81 include a processing of forming the holes 87 and the oxide film 88. The holes 87 and the oxide film 88 are conventionally formed in such a way as shown in FIG. 6, for example (see the Japanese Unexamined Patent Application Publication No. 2009-158862).

Figure 6:
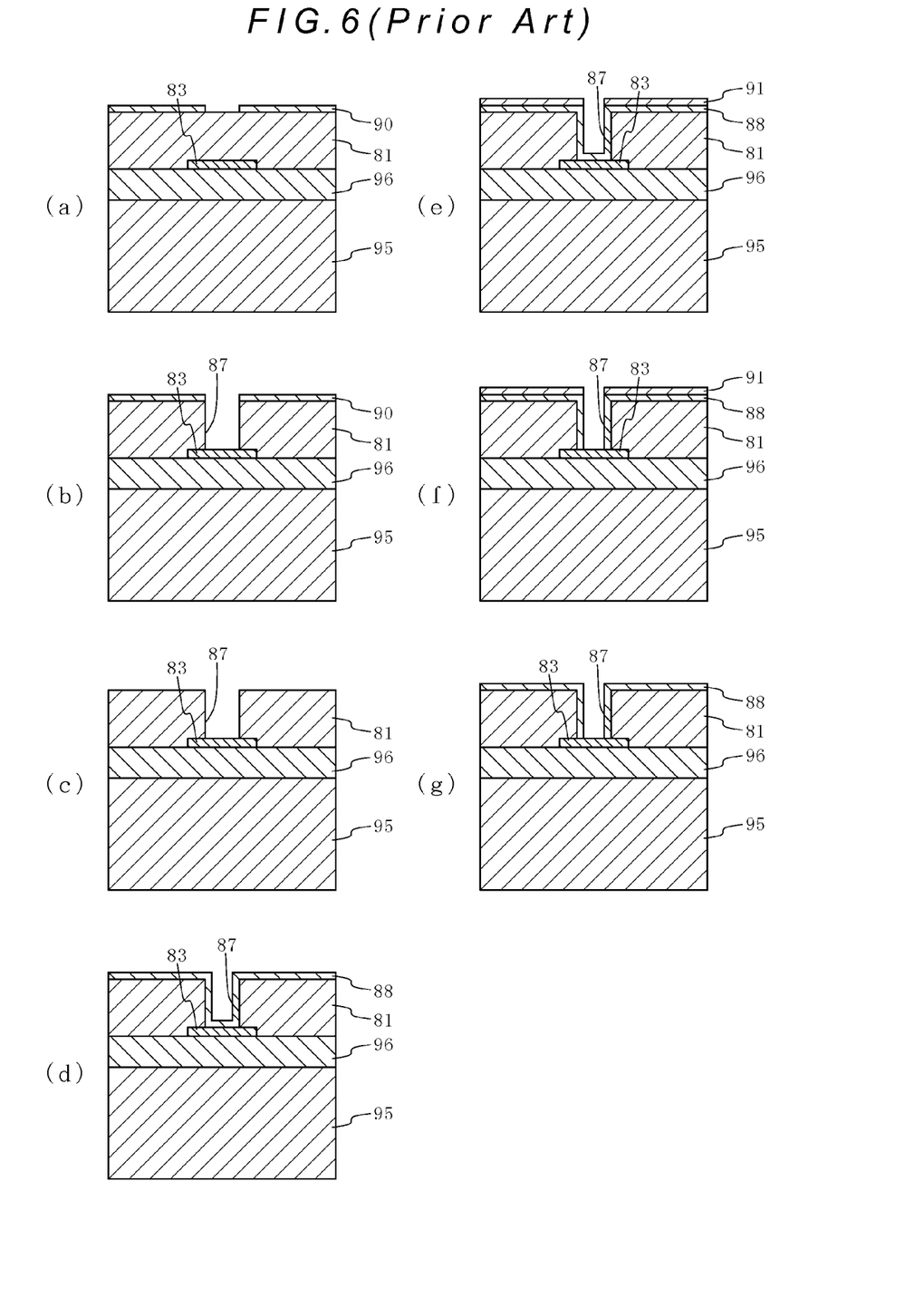
FIG. 6 is an illustration showing a series of processings for forming an oxide film on a surface of a silicon substrate excluding a hole and on side walls of the hole.

That is, initially, a first step of forming a resist film 90 having a mask pattern of a predetermined shape on the surface of the silicon substrate 81 (see FIG. 6(a)) is performed and then a second step of etching the surface of the silicon substrate 81 using the resist film 90 as mask (see FIG. 6(b)) is performed. In the second step, plasma is generated from an etching gas and the silicon substrate 81 is etched until the top surfaces of the pad electrodes 83 are exposed. Thereby, the holes 87 are formed in the surface of the silicon substrate 81.

Subsequently, a third step of removing the resist film 90 from the top surface of the silicon substrate 81 (see FIG. 6(c)) is performed and then a fourth step of forming the oxide film 88 on the surface of the silicon substrate 81 (see FIG. 6(d)) is performed. In the fourth step, plasma is generated from a deposition gas and the oxide film 88 is formed on the surface of the silicon substrate 81 including the side walls and the bottom surfaces of the holes 87 (the top surfaces of the pad electrodes 83).

Thereafter, a fifth step of forming a resist film 91 having a mask pattern of a predetermined shape on the oxide film 88 formed on the surface of the silicon substrate 81 excluding the portions of the holes 87 (hereinafter, referred to as "the top surface of the silicon substrate 81") (see FIG. 6(e)) is performed and then a sixth step of removing the oxide film 88 formed on the bottom surfaces of the holes 87 (the surfaces of the pad electrodes 83) by etching the oxide film 88 using the resist film 91 as mask (see FIG. 6(f)) is performed. In the sixth step, plasma is generated from an etching gas and the oxide film 88 is etched until the surfaces of the pad electrodes 83 are exposed.

Then, a seventh step of removing the resist film 91 from the surface of the oxide film 88 (see FIG. 6(g)) is performed. Thus, the holes 87 are formed in the silicon substrate 81 and the oxide film 88 is formed on the top surface of the silicon substrate 81 and on the side walls of the holes 87. Thereafter, the holes 87 are filled with an electrically conductive material and the wiring films 85 and the passivation film 89 are formed on the top surface of the oxide film 88, thereby forming the through electrodes 86.

However, forming the holes 87 and the oxide film 88 in this way causes the following problems. That is, in order to form the oxide film 88 on the top surface of the silicon substrate 81 and on the side walls of the holes 87, it is necessary to remove the oxide film 88 formed on the bottom surfaces of the holes 87 after temporarily forming the oxide film 88 on the entire surface of the silicon substrate 81 including the side walls and the bottom surfaces of the holes 87. However, performing the step of forming the resist film 91 for removing the oxide film 88 on the bottom surfaces of the holes 87 (the fifth step), the step of removing the oxide film 88 formed on the bottom surfaces of the holes 87 by etching (the sixth step) and the step of removing the resist film 91 (the seventh step) successively as described above for removing the oxide film 88 formed on the bottom surfaces requires many steps for removing the oxide film 88 formed on the bottom surfaces of the holes 87, which leads to high costs and lengthens the tact time in device production. Further, the increase of the number of steps can be a factor in the decline of the yield due to a trouble caused by the devices.

Figure 7:
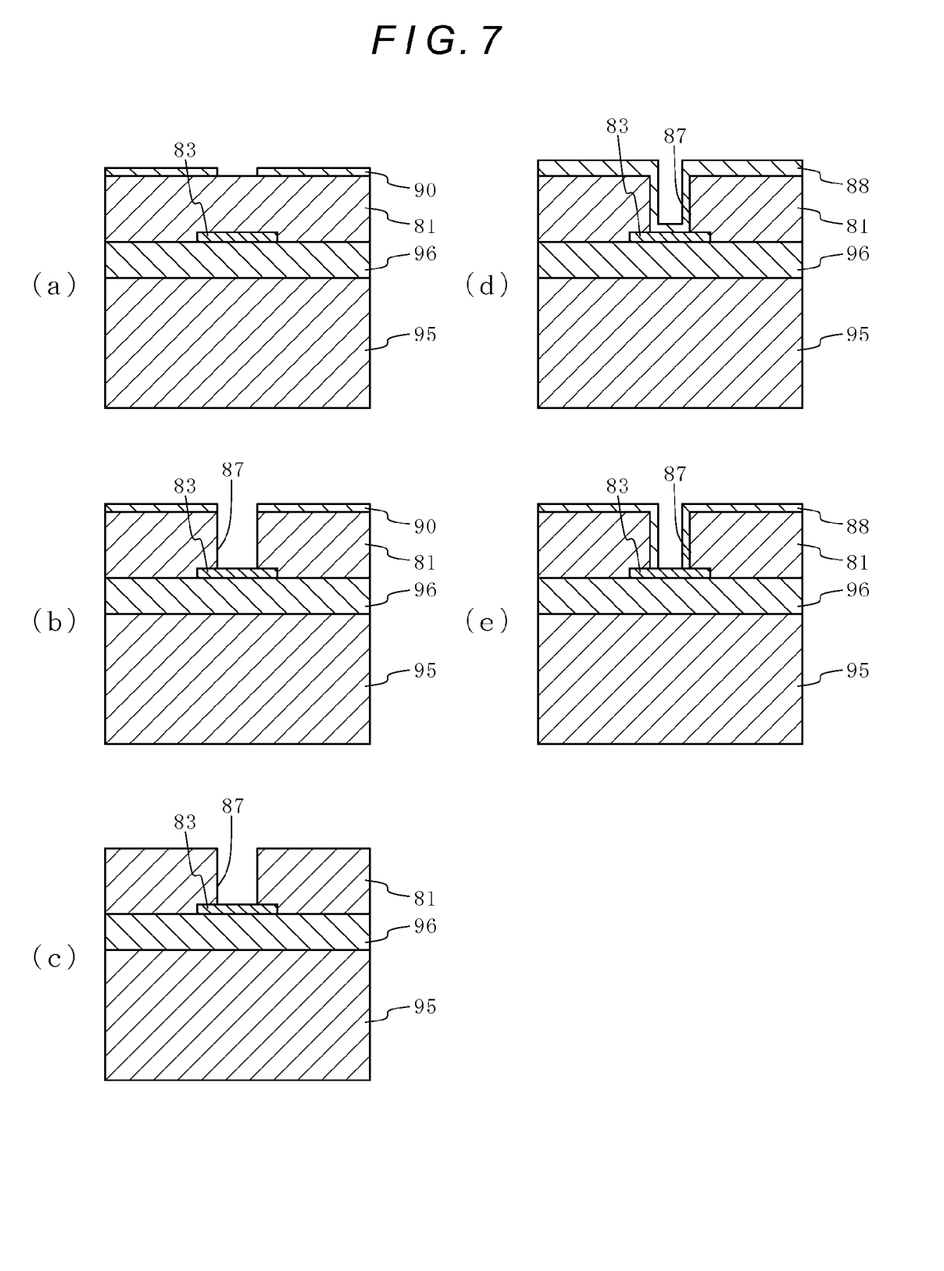
FIG. 7 is an illustration showing a series of processings for forming an oxide film on a surface of a silicon substrate excluding a hole and on side walls of the hole.

Therefore, there is taken a measure in which, when forming the oxide film 88 on the surface of the silicon substrate 81 including the side walls of the holes 87 and the bottom surfaces of the holes 87 (the surfaces of the pad electrodes 83) in the fourth step, as shown in FIG. 7(d), the oxide film 88 is formed so that it has a larger film thickness on the top surface of the silicon substrate 81 than on the bottom surfaces of the holes 87, and in the fifth step following this forth step, as shown in FIG. 7(e), the surface of the silicon substrate 81 (oxide film 88) is anisotropically etched so that the oxide film 88 formed on the bottom surfaces of the holes 87 is removed and the surfaces of the pad electrodes 83 are therefore exposed.

Forming the oxide film 88 so that it has a larger film thickness on the top surface of the silicon substrate 81 as described above makes it possible to remove the oxide film 88 formed on the bottom surfaces of the holes 87 with the oxide film 88 formed on the top surface of the silicon substrate 81 remaining at the time of anisotropic etching.

Therefore, since it is possible to omit the step of forming the resist film 91 for removing the oxide film 88 formed on the bottom surfaces of the holes 87 (the step shown in FIG. 6(*e*)) and the step of removing the resist film 91 (the step shown in FIG. 6(*g*)), which is performed after removing the oxide film 88 formed on the bottom surfaces of the holes 87, the oxide film 88 formed on the bottom surfaces of the holes 87 can be efficiently removed, and the reduction of costs can be achieved by the shortening of the process. Further, it is possible to eliminate the possibility that the yield declines due to a trouble caused by the devices. It is noted that the FIGS. 7(*a*) to 7(*c*) in FIG. 7 correspond to FIG. 6(*a*) (first step), FIG. 6(*b*) (second step) and FIG. 6(*c*) (third step), respectively.

CITATION LIST

Patent Literature

Patent document 1: Japanese Unexamined Patent Application Publication No. 2009-158862

SUMMARY OF THE DISCLOSURE

By the way, the ratio of the film thickness of the oxide film 88 formed on the top surface of the silicon substrate 81 to the film thickness of the oxide film 88 formed on the bottom surfaces of the holes 87, which is the film thickness ratio to be obtained when forming the oxide film 88 so that it has a larger film thickness on the top surface of the silicon substrate 81 than on the bottom surfaces of the holes 87, varies depending on, for example, the processing conditions for the deposition and the anisotropic etching and the film thickness of the oxide film 88 to be left after the anisotropic etching.

Figure 8:
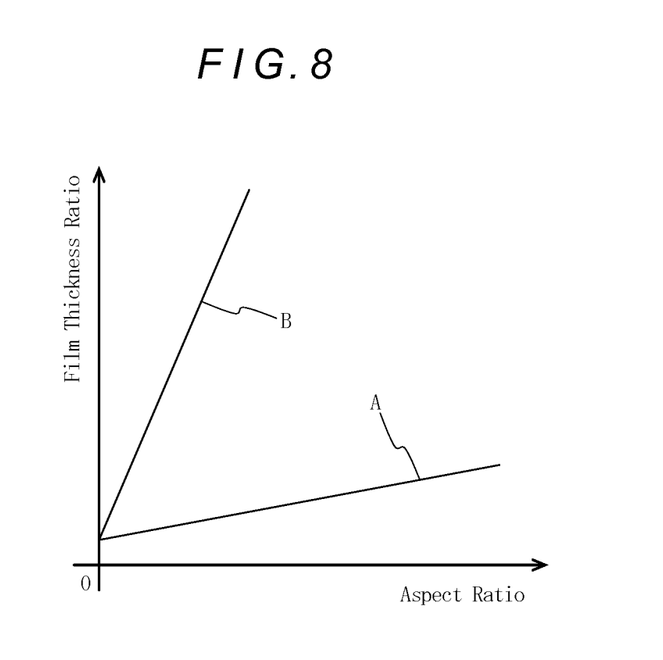
FIG. 8 shows graphs of the relationships between film thickness ratio and aspect ratio.

However, when using gas mixture including tetraethoxysilane (TEOS) and oxygen (O2) or gas mixture including silane (SiH4) and nitrous oxide (N2O), which are generally used as deposition gas, only such a film thickness ratio as shown in FIG. 8 can be obtained. That is, FIG. 8 shows graphs showing the relationship between the film thickness ratio obtained at the time of the deposition and the aspect ratio of the hole 87, and the film thickness ratio obtained becomes larger as the aspect ratio becomes larger. However, as shown by the solid line A, only a relatively small film thickness ratio can be obtained when using gas mixture including tetraethoxysilane and oxygen, and, as shown by the solid line B, only a relatively large film thickness ratio can be obtained when using gas mixture including silane and nitrous oxide. It is noted that, although the straight lines A and B each vary depending on the deposition conditions etc., they show an almost similar tendency no matter what deposition conditions are applied.

For this reason, for example, in a case where, after forming the oxide film 88 so that it has a larger film thickness on the top surface of the silicon substrate 81 than on the bottom surfaces of the holes 87, the surface of the silicon substrate 81 is anisotropically etched until the oxide film 88 formed on the bottom surfaces of the holes 87 is completely removed, there often occur problems that when the oxide film 88 is formed using gas mixture including tetraethoxysilane and oxygen, only a small film thickness ratio can be obtained and the film thickness of the oxide film 88 remaining after the etching is therefore thin and it is not possible to secure the film thickness of the oxide film 88, and that if the oxide film 88 is formed even slightly non-uniformly on the top surface of the silicon substrate 81, thin portions of the oxide film 88 are completely removed and the surface of the underlying is etched. Further, in order to prevent such disadvantages, like the fifth step shown in FIG. 6(*e*), it is necessary to form the resist film 91 and remove the oxide film 88 formed on the bottom surfaces of the holes 87. On the other hand, when the oxide film 88 is formed using gas mixture including silane and nitrous oxide, because only a large film thickness ratio can be obtained, even after the oxide film 88 formed on the bottom surfaces of the holes 87 has been removed, it is necessary to perform etching until the film thickness of the oxide film 88 remaining on the top surface of the silicon substrate 81 becomes thin. Further, there occur problems that the time for forming the oxide film 88 of a necessary film thickness on the side walls of the holes 87 is lengthened, that the amount of the oxide film 88 deposited inside the deposition device is increased and therefore the frequency of cleaning is increased and the time for cleaning is lengthened, and that the productivity is greatly lowered due to these problems.

Therefore, it is very preferable if the oxide film 88 with an optimum film thickness ratio can be formed at the time of deposition.

It is noted that, although both gas mixture including tetraethoxysilane and oxygen and gas mixture including silane and nitrous oxide are gas for forming an SiO2 film as the oxide film 88, the reason for the difference in the manner of deposition of the oxide film 88 as described above is that the reaction mechanism of tetraethoxysilane and oxygen is different from that of silane and nitrous oxide.

That is, the reason why the film thickness ratio is small when using gas mixture including tetraethoxysilane and oxygen is that because tetraethoxysilane and oxygen react with each other to generate an oxide (to form the oxide film 88) after deposition onto the surface of the silicon substrate 81 including the side walls and the bottom surfaces of the holes 87, they easily enter the holes 87 and reach the bottom surfaces thereof. On the other hand, the reason why the film thickness ratio is large when using gas mixture including silane and nitrous oxide is that because, even before deposition onto the surface of the silicon substrate 81, silane and nitrous oxide react with each other to generate an oxide once the temperature reaches a certain reaction temperature, they cannot easily enter the holes 87. Further, the reason why the film thickness ratio becomes larger as the aspect ratio becomes larger is that it becomes harder for tetraethoxysilane and oxygen or silane and nitrous oxide to reach the bottom surfaces of the holes 87 as the aspect ratio becomes larger.

The present invention has been achieved as a result of repeated studies carried out by the inventors, and an object thereof is to provide a deposition method capable of forming an oxide film with a predetermined film thickness ratio using two sorts of deposition gas: one for obtaining a small film thickness ratio and the other for obtaining a large film thickness ratio.

The present invention, for achieving the above-described object, relates to a deposition method of forming an oxide film on a surface of a substrate including side walls and a bottom surface of a hole or trench by a plasma generated from a deposition gas, the oxide film being formed to have a larger film thickness on the surface of the substrate excluding the side walls and the bottom surface of the hole or trench than on the bottom surface of the hole or trench so that a film thickness ratio of the film thickness of the oxide film formed on the surface of the substrate excluding the side walls and the bottom surface of the hole or trench to the film thickness of the oxide film formed on the bottom surface of the hole or trench becomes a predetermined ratio, the deposition method characterized in that
when a target film thickness ratio is in a range enclosed by a straight line showing the relationship between the film thickness ratio and the aspect ratio of the hole or trench when using a first gas as the deposition gas and a straight line showing the relationship between the film thickness ratio and the aspect ratio of the hole or trench when using, as the deposition gas, a second gas with which a film thickness ratio larger than that obtained when using the first gas can be obtained, the oxide film with the target film thickness ratio is formed using the two gases, the first gas and the second gas.

According to the present invention, in forming an oxide film having a larger film thickness on a surface of a substrate excluding side walls and a bottom surface of a hole or trench (hereinafter, referred to as "the top surface of the substrate") than on the bottom surface of the hole or trench so that a film thickness ratio of the film thickness of the oxide film formed on the top surface of the substrate to the film thickness of the oxide film formed on the bottom surface of the hole or trench becomes a predetermined ratio, when a target film thickness ratio is in a range enclosed by a straight line showing the relationship between the film thickness ratio and the aspect ratio of the hole or trench when using a first gas as deposition gas and a straight line showing the relationship between the film thickness ratio and the aspect ratio of the hole or trench when using, as deposition gas, a second gas with which a film thickness ratio larger than that obtained when using the first gas can be obtained, the oxide film with the target film thickness ratio is formed using the two gases, i.e., the first gas and the second gas.

Thus, combining the deposition using the first gas and the deposition using the second gas makes it possible to form the oxide film with a film thickness ratio which can be obtained neither by using the first gas alone nor by using the second gas alone, and it is therefore possible to form an oxide film with a predetermined film thickness ratio. Therefore, it is possible to form the oxide film with an optimum film thickness ratio at the time of deposition.

Thereby, for example, in a case where the oxide film having a larger film thickness on the top surface of the substrate than on the bottom surface of the hole or trench is formed and then the substrate is anisotropically etched to remove the oxide film formed on the bottom surface of the hole or trench, it is possible to prevent the occurrence of problems that the film thickness of the oxide film remaining after the etching is thin and the film thickness of the oxide film therefore cannot be secured, and that if the oxide film is formed even slightly non-uniformly on the top surface of the substrate, thin portions of the oxide film are completely removed and the surface of the underlying is therefore etched, which problems are caused by the fact that only a small film thickness ratio can be obtained, and a problem that, in order to prevent such disadvantages as described above, the oxide film formed on the bottom surface of the hole or trench has to be removed after forming a resist film. Further, it is possible to prevent the occurrence of problems that, even after the oxide film formed on the bottom surface of the hole or trench is removed, etching has to be performed until the film thickness of the oxide film remaining on the top surface of the substrate becomes thin, that the time for forming the oxide film having a necessary film thickness on the side walls of the hole or trench is lengthened, and that the amount of the oxide film deposited inside the deposition device is increased and therefore the frequency of cleaning is increased and the time for cleaning is lengthened, which problems are caused by the fact that only a large film thickness ratio can be obtained, and a problem that the productivity is greatly lowered due to these problems.

It is noted that gas mixture including tetraethoxysilane and oxygen can be given as the first gas, for example, and gas mixture including silane and nitrous oxide can be given as the second gas, for example. In this case, an oxide film is formed using one of the first gas and the second gas and then an oxide film is formed using the other, thereby forming the oxide film with the target film thickness ratio with the oxide film formed by tetraethoxysilane and oxygen and the oxide film formed by silane and nitrous oxide.

Further, gas mixture including tetraethoxysilane and nitrous oxide can be given as the first gas, for example. In this case, although the oxide film may be formed by using the first gas and the second gas separately as described above, the oxide film may be formed by using the first gas and the second gas simultaneously for forming the oxide film with the target film thickness ratio with an oxide film formed by tetraethoxysilane and nitrous oxide and an oxide film formed by silane and nitrous oxide.

The reason therefor is that, even when using gas mixture including tetraethoxysilane and nitrous oxide and gas mixture including silane and nitrous oxide simultaneously, the tetraethoxysilane and the nitrous oxide react with each other and the silane and the nitrous oxide react with each other in a manner similar to when using gas mixture including tetraethoxysilane and oxygen and gas mixture including silane and nitrous oxide separately.

It is noted that the ratio of the deposition amount of the oxide film formed by the first gas to the deposition amount of the oxide film formed by the second gas for forming the oxide film with a predetermined film thickness ratio may be determined experientially or on the basis of the equation for the straight line showing the relationship between the film thickness ratio and the aspect ratio of the hole or trench when using the first gas and the equation for the straight line showing the relationship between the film thickness ratio and the aspect ratio of the hole or trench when using the second gas, for example.

As described above, according to the deposition method of the present invention, an oxide film with a predetermined film thickness ratio can be formed using two types of deposition gases, a first gas with which a small film thickness ratio is obtained and a second gas with which a large film thickness ratio is obtained.

DETAILED DESCRIPTION

Figure 1:
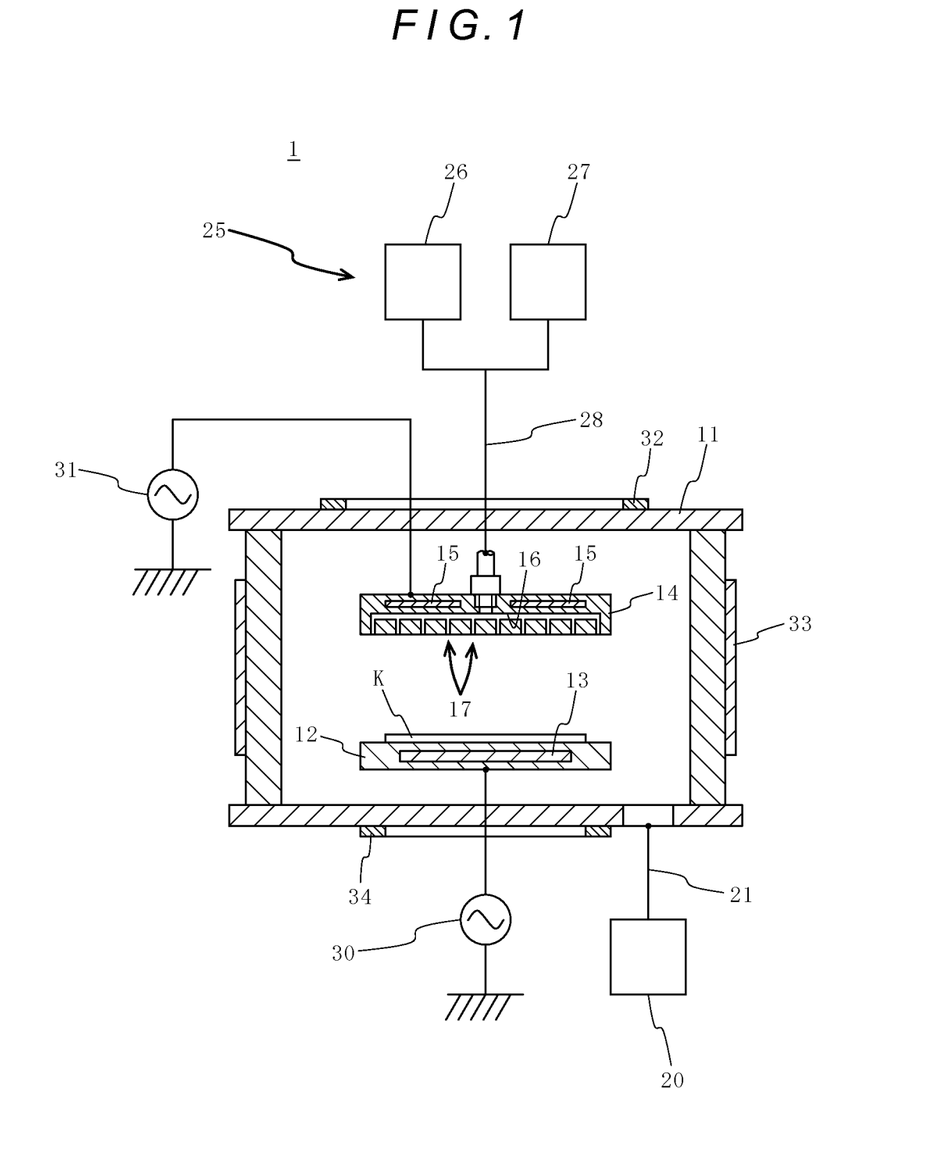
FIG. 1 is a sectional view showing a schematic configuration of a deposition device for performing a deposition method according to one embodiment of the present invention.

Hereinafter, a specific embodiment of the present invention will be described on the basis of the accompanying drawings. It is noted that the embodiment describes, as an example, a case where, in an image sensor 80 as shown in FIG. 5, an oxide film 88 is formed on a silicon substrate 81. Further, in the embodiment, deposition is performed on the silicon substrate 81 (a structure K in which the underside of the silicon substrate 81 and the top surface of a glass substrate 95 are bonded together by an adhesive 96) using a deposition device 1 as shown in FIG. 1.

Initially, the deposition device 1 is described. The deposition device 1 has, as shown in FIG. 1, a processing chamber 11 having a closed space, a plate-shaped lower electrode 12 which is disposed in the processing chamber 11 and on which the structure K is to be placed, a plate-shaped upper electrode 14 which is disposed above the lower electrode 12 in the processing chamber 11 and which is provided parallel to the lower electrode 12, an exhaust device 20 reducing the pressure within the processing chamber 11, a gas supply device 25 supplying a deposition gas into the processing chamber 11, an RF power supply unit 30 supplying RF power to the lower electrode 12, and an RF power supply unit 31 supplying RF power to the upper electrode 14.

Annular heaters 32, 33, 34 are provided on the outsides of a top plate, a side wall and a bottom plate of the processing chamber 11, respectively. The lower electrode 12 and the upper electrode 14 have heaters 13, 15 built therein, respectively. Further, the upper electrode 14 has a gas flow path 16 through which the deposition gas supplied from the gas supply device 25 flows and a plurality of discharge ports 17 which communicate with the gas flow path 16 and which are open at the surface facing the lower electrode 12.

The exhaust device 20 has an exhaust pipe 21 connected to the lower surface of the processing chamber 11, and exhausts the air within the processing chamber 11 through the exhaust pipe 21 to thereby reduce the pressure within the processing chamber 11 to a predetermined pressure.

The gas supply device 25 has a first gas supply section 26 supplying, as deposition gas, gas mixture including tetraethoxysilane (TEOS) and oxygen (O2), a second gas supply section 27 supplying, as deposition gas, gas mixture including silane (SiH4) and nitrous oxide (N2O), and a supply pipe 28, one end of which is connected to the gas flow path 16 of the upper electrode 14 and the other end of which is branched and connected to the gas supply sections 26, 27. The gas supply device 25 supplies a deposition gas from the first gas supply section 26 or the second gas supply section 27 into the processing chamber 11 through the supply pipe 28, the gas flow path 16 and the discharge ports 17.

The RF power supply units 30, 31 supply RF power to the electrodes 12, 14, respectively, thereby generating plasma from the deposition gas which is discharged through the discharge ports 17 and supplied into the processing chamber 11.

Subsequently, there will be explained a deposition method of forming an oxide film 88 having a larger film thickness on the surface of the silicon substrate 81 excluding the portions of holes 87 (hereinafter, referred to as "the top surface of the silicon substrate 81") than on the bottom surfaces of the holes 87 using the deposition device 1 configured as described above so that a film thickness ratio of the film thickness of the oxide film 88 formed on the top surface of the silicon substrate 81 to the film thickness of the oxide film 88 formed on the bottom surfaces of the holes 87 becomes a predetermined ratio. It is noted that, in the following explanation, the predetermined ratio is set within a range enclosed by a straight line A showing the relationship between the film thickness ratio to the aspect ratio of the hole 87 (see FIG. 8), which is obtained when using gas mixture including tetraethoxysilane and oxygen, and a straight line B showing the relationship between the film thickness ratio to the aspect ratio of the hole 87 (see FIG. 8), which is obtained when using gas mixture including silane and nitrous oxide.

Figure 2:
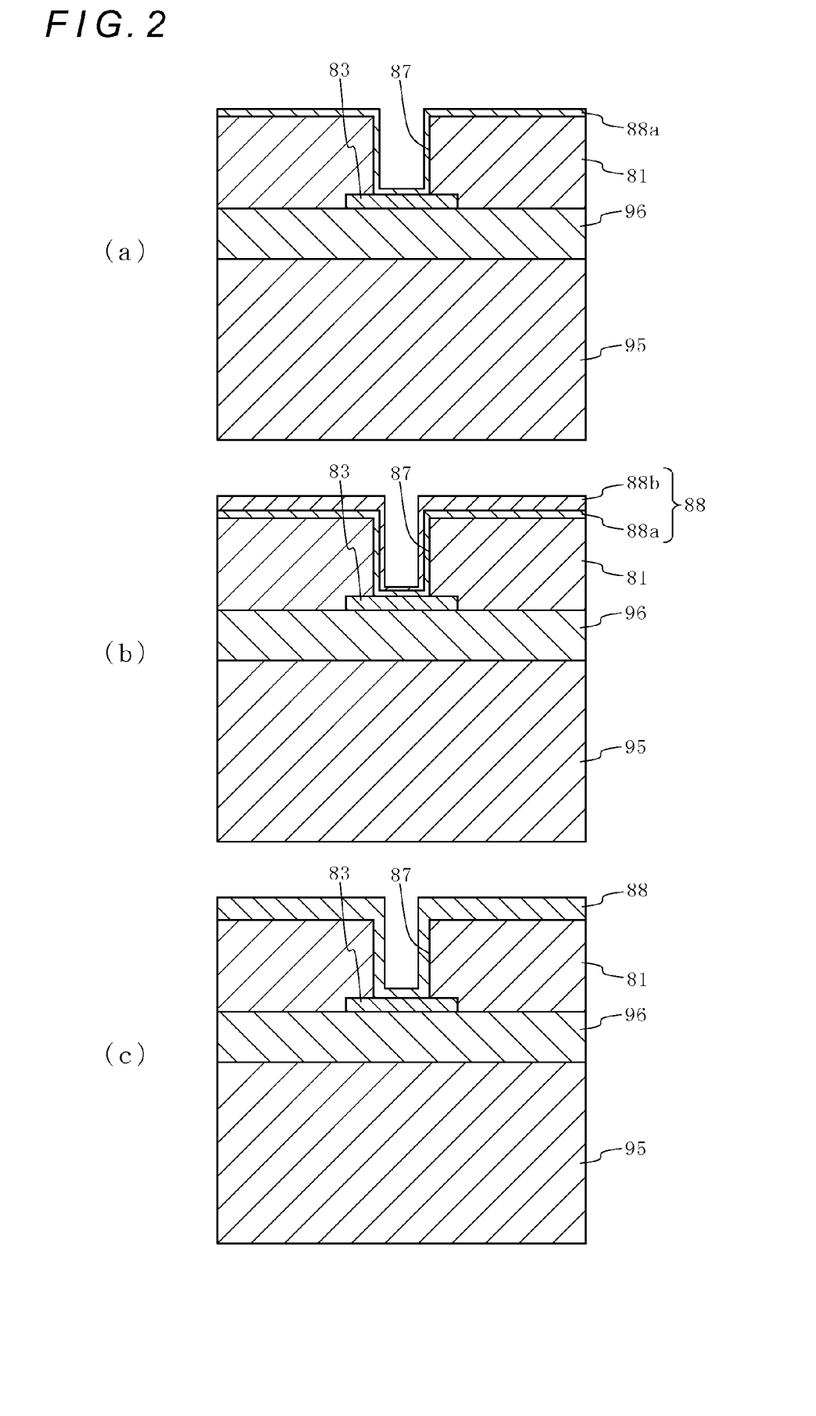
FIG. 2 is an illustration for explaining the deposition method according to the embodiment.

The structure K is loaded into the deposition device 1 and placed on the lower electrode 12, a deposition gas is supplied from the gas supply device 25 into the processing chamber 11, the pressure within the processing chamber 11 is reduced to a predetermined pressure by the exhaust device 20, and RF power is supplied to the electrodes 12, 14 by the RF power supply units 30, 31, respectively, thereby forming the oxide film (SiO2 film) 88. At this time, as shown in FIG. 2($a$), gas mixture including tetraethoxysilane and oxygen is supplied from the first gas supply section 26 to thereby form an oxide film 88$a$, and then, as shown in FIG. 2($b$), gas mixture including silane and nitrous oxide is supplied from the second gas supply section 27 to thereby form an oxide film 88$b$, thereby forming the oxide film 88 with the predetermined film thickness ratio with the oxide film 88$a$ formed by the tetraethoxysilane and the oxygen and the oxide film 88$b$ formed by the silane and the nitrous oxide (see FIG. 2($c$)).

Thus, combining the deposition using gas mixture including tetraethoxysilane and oxygen in which only a relatively small film thickness ratio can be obtained and the deposition using gas mixture including silane and nitrous oxide in which only a relatively large film thickness ratio can be obtained makes it possible to from the oxide film 88 with a film thickness ratio which can obtained neither by using gas mixture including tetraethoxysilane and oxygen alone nor by using gas mixture including silane and nitrous oxide alone, and it is therefore possible to form the oxide film 88 with a predetermined film thickness ratio. Therefore, it is possible to form the oxide film 88 with an optimal film thickness ratio at the time of deposition.

The ratio (a to b) of the deposition amount of the oxide film 88$a$ formed by the gas mixture including tetraethoxysilane and oxygen to the deposition amount of the oxide film 88$b$ formed by the gas mixture including silane and nitrous oxide can be determined as described below, for example.

Figure 3:
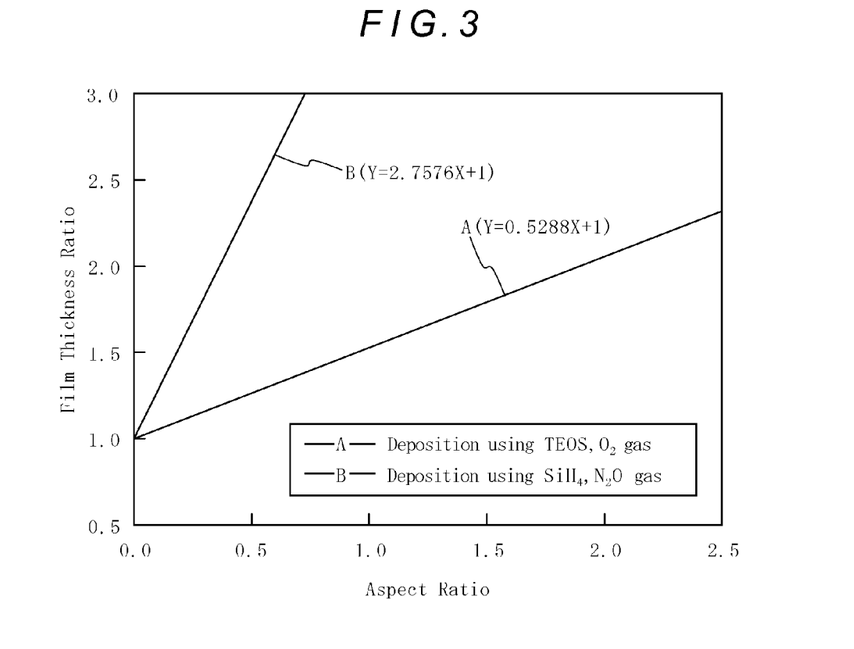
FIG. 3 shows graphs of examples of the relationship between film thickness ratio and aspect ratio.

For example, there is considered a case where: as shown in FIG. 3, the equation for the straight line A showing the relationship between the film thickness ratio to the aspect ratio, which is obtained when using gas mixture including tetraethoxysilane and oxygen, is expressed by $Y=0.5288 \times X+1$ wherein X represents the aspect ratio and Y represents the film thickness ratio; the equation for the straight line B showing the relationship between the film thickness ratio to the aspect ratio, which is obtained when using gas mixture including silane and nitrous oxide, is expressed by $Y=2.7576 \times X+1$ wherein X represents the aspect ratio and Y represents the film thickness ratio; and the predetermined film thickness ratio c is 2 and the aspect ratio X of the hole 87 in which the oxide film 88 is formed is 1.

In this case, the relationship of the following equation (Equation (1)) is established between the film thickness ratio of the whole (the total deposition amount), that is, the predetermined film thickness ratio, the film thickness ratio which is obtained when using gas mixture including tetraethoxysilane and oxygen (the deposition amount of the oxide film 88$a$ formed by the gas mixture including tetraethoxysilane and oxygen) and the film thickness ratio which is obtained when using gas mixture including silane and nitrous oxide (the deposition amount of the oxide film 88b formed by the gas mixture including silane and nitrous oxide).

$$c=a(0.5288\times X+1)+b(2.7576\times X+1) \quad \text{(Equation 1)}$$

(wherein b=(1−a))

When c=2, X=1, b=(1−a) are substituted for the Equation (1), the values of a and b can be obtained. Specifically, a=0.79, b=0.21 are obtained.

Therefore, in this case, the oxide film 88 with the film thickness ratio of 2 can be formed on the surface of the silicon substrate 81 having the holes 87 having the aspect ratio of 1 by means of adjusting the deposition amount of the oxide film 88a formed by the gas mixture including tetraethoxysilane and oxygen and the deposition amount of the oxide film 88b formed by the gas mixture including silane and nitrous oxide so that the ratio of the deposition amount of the oxide film 88a formed by the gas mixture including tetraethoxysilane and oxygen to the deposition amount of the oxide film 88b formed by the gas mixture including silane and nitrous oxide becomes 0.79 to 0.21.

Figure 4:
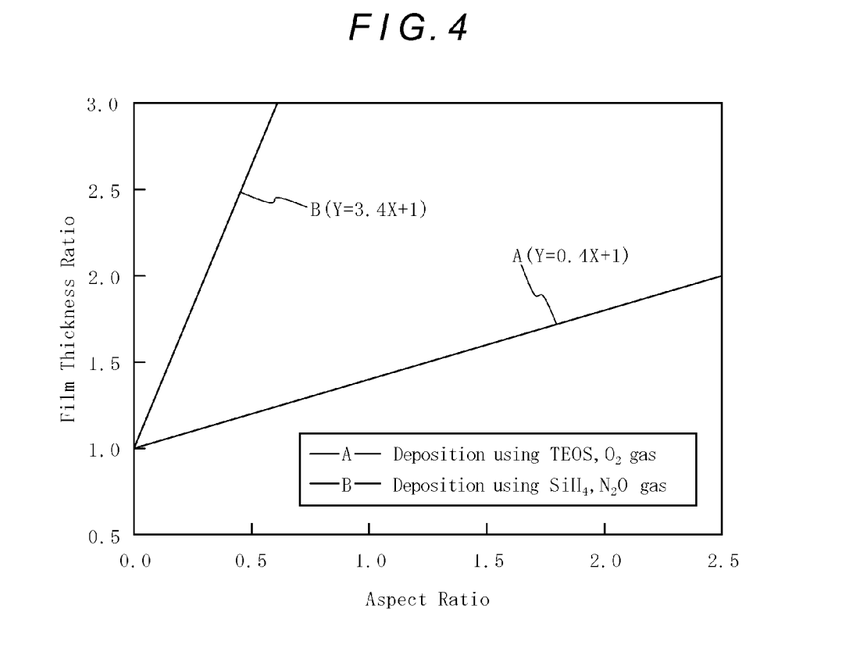
FIG. 4 shows graphs of examples of the relationship between film thickness ratio and aspect ratio.

Further, for example, in a case where: as shown in FIG. 4, the equation for the straight line A showing the relationship between the film thickness ratio and the aspect ratio, which is obtained when using gas mixture including tetraethoxysilane and oxygen, is expressed by $Y=0.4\times X+1$ wherein X represents the aspect ratio and Y represents the film thickness ratio; the equation for the straight line B showing the relationship between the film thickness ratio and the aspect ratio, which is obtained when using gas mixture including silane and nitrous oxide, is expressed by $Y=3.4\times X+1$ wherein X represents the aspect ratio and Y represents the film thickness ratio; and the predetermined film thickness ratio c is 3 and the aspect ratio X of the hole 87 in which the oxide film 88 is formed is 2, similarly, the following equation (Equation (2)) is established.

$$c=a(0.4\times X+1)+b(3.4\times X+1) \quad \text{(Equation 2)}$$

(wherein b=(1−a))

When c=3, X=2, b=(1−a) are substituted for the Equation 2, the values of a and b can be obtained. Specifically, a=0.8, b=0.2 are obtained.

Therefore, in this case, the oxide film 88 with the film thickness ratio of 3 can be formed on the surface of the silicon substrate 81 having the holes 87 having the aspect ratio of 2 by means of adjusting the deposition amount of the oxide film 88a formed by the gas mixture including tetraethoxysilane and oxygen and the deposition amount of the oxide film 88b formed by the gas mixture including silane and nitrous oxide so that the ratio of the deposition amount of the oxide film 88a formed by the gas mixture including tetraethoxysilane and oxygen to the deposition amount of the oxide film 88b formed by the gas mixture including silane and nitrous oxide becomes 0.8 to 0.2.

Thus, according to the deposition method of the embodiment, the oxide film 88 with a predetermined film thickness ratio can be formed. Therefore, for example, in a case where the oxide film 88 having a larger film thickness on the top surface of the silicon substrate 81 than on the bottom surfaces of the holes 87 is formed (see FIG. 7(d)) and then the silicon substrate 81 is anisotropically etched to remove the oxide film 88 formed on the bottom surfaces of the holes 87 (see FIG. 7(e)), it is possible to prevent the occurrence of problems that the film thickness of the oxide film 88 remaining after the etching is thin and the film thickness of the oxide film 88 therefore cannot be secured, and that, if the oxide film 88 is formed even slightly non-uniformly on the top surface of the silicon substrate 81, thin portions of the oxide film 88 are completely removed and the surface of the underlying is therefore etched, which problems are caused by the fact that only a small film thickness ratio can be obtained, and a problem that, in order to prevent such disadvantages as described above, the oxide film 88 formed on the bottom surfaces of the holes 87 has to be removed after forming a resist film 91 like the fifth step shown in FIG. 6(e). Further, it is possible to prevent the occurrence of problems that, even after the oxide film 88 formed on the bottom surfaces of the holes 87 has been removed, etching has to be performed until the film thickness of the oxide film 88 remaining on the top surface of the silicon substrate 81 becomes thin, that the time for forming the oxide film 88 having a necessary film thickness on the side walls of the holes 87 is lengthened, and that the amount of the oxide film deposited inside the deposition device 1 is increased and therefore the frequency of cleaning is increased and the time for cleaning is lengthened, which problems are caused by the fact that only a large film thickness ratio can be obtained, and a problem that the productivity is greatly lowered due to these problems.

Thus, an embodiment of the present invention has been described. However, a specific embodiment in which the present invention can be implemented is not limited thereto.

In the above embodiment, gas mixture including tetraethoxysilane and oxygen is supplied from the first gas supply section 26 to form the oxide film 88a and then gas mixture including silane and nitrous oxide is supplied from the second gas supply section 27 to form the oxide film 88b. However, it is also possible to, after supplying gas mixture including silane and nitrous oxide from the second gas supply section 27 to form the oxide film 88b, supply gas mixture including tetraethoxysilane and oxygen from the first gas supply section 26 to form the oxide film 88a.

Further, a configuration is possible in which the first gas supply section 26 is configured to supply gas mixture including tetraethoxysilane and nitrous oxide as deposition gas, and gas mixture including tetraethoxysilane and nitrous oxide and gas mixture including silane and nitrous oxide are simultaneously supplied into the processing chamber 11 from the first gas supply section 26 and the second gas supply section 27.

Even when gas mixture including tetraethoxysilane and nitrous oxide and gas mixture including silane and nitrous oxide are simultaneously supplied, the tetraethoxysilane and the nitrous oxide react with each other and the silane and the nitrous oxide react with each other in a manner similar to when gas mixture including tetraethoxysilane and oxygen and gas mixture including silane and nitrous oxide are supplied separately. Therefore, the oxide film 88 with a predetermined film thickness ratio can be formed with an oxide film 88a formed by the tetraethoxysilane and the nitrous oxide and an oxide film 88b formed by the silane and the nitrous oxide.

In this case also, the ratio (a to b) of the deposition amount of the oxide film 88a formed by the gas mixture including tetraethoxysilane and nitrous oxide to the deposition amount of the oxide film 88b formed by the gas mixture including silane and nitrous oxide can be determined in a way similar to the above, and the oxide film 88 with a predetermined film thickness ratio can be formed by adjusting the deposition amounts so that the ratio determined as described above is achieved. It is noted that it is advantageous that the supply ratio of the gas mixture including tetraethoxysilane and nitrous oxide to the gas mixture including silane and nitrous oxide is adjusted to such a ratio that the oxide film 88 is formed with the determined ratio.

Furthermore, a configuration is possible in which the second gas supply section 27 is omitted and the first gas supply section 26 is configured to supply gas mixture including tetraethoxysilane, silane and nitrous oxide as deposition gas. In this case also, the oxide film 88 with a predetermined film thickness ratio can be formed with an oxide film 88a formed by the tetraethoxysilane and the nitrous oxide and an oxide film 88b formed by the silane and the nitrous oxide. Further, the ratio (a to b) of the deposition amount of the oxide film 88a formed by the tetraethoxysilane and the nitrous oxide to the deposition amount of the oxide film 88b formed by the silane and the nitrous oxide can be determined in a similar way. It is noted that it is advantageous that the mixing ratio of the gas mixture including tetraethoxysilane, silane and nitrous oxide is adjusted to such a mixing ratio that the oxide film 88 is formed with the determined ratio.

In the above embodiments, gas mixture including tetraethoxysilane and oxygen, gas mixture including silane and nitrous oxide, gas mixture including tetraethoxysilane and nitrous oxide, and gas mixture including tetraethoxysilane, silane and nitrous oxide are used as deposition gas. However, the gas mixture may include components other than tetraethoxysilane, silane and nitrous oxide.

Further, in the above embodiments, the deposition method of the present invention is performed using the deposition device 1. However, it is possible to use a deposition device having another configuration for performing the deposition method of the present invention.

Furthermore, the target film thickness ratio can be arbitrarily set as long as it is in a range enclosed by the straight line A showing the relationship between the film thickness ratio and the aspect ratio of the hole 87 which is obtained when using gas mixture including tetraethoxysilane and oxygen and the straight line B showing the relationship between the film thickness ratio and the aspect ratio of the hole 87 which is obtained when using gas mixture including silane and nitrous oxide.

What is claimed is:

1. A deposition method of forming an oxide film on a surface of a substrate including side walls and a bottom surface of a hole or trench by a plasma generated from a deposition gas, the oxide film being formed to have a surface film thickness located on the surface of the substrate excluding the side walls and the bottom surface of the hole or trench and a bottom film thickness located on the bottom surface of the hole or trench, wherein the surface film thickness is larger than the bottom film thickness, and a film thickness ratio of the surface film thickness to the bottom film thickness comprises a predetermined ratio, the deposition method characterized in that when a target film thickness ratio is in a range enclosed by a first straight line (A) expressing a linear relationship between the film thickness ratio and the aspect ratio of the hole or trench when using a first gas comprising a first gas mixture including tetraethoxysilane and nitrous oxide as the deposition gas and a second straight line (B) expressing a linear relationship between the film thickness ratio and the aspect ratio of the hole or trench when using, as the deposition gas, a second gas comprising a second gas mixture including silane and nitrous oxide with which a film thickness ratio larger than that obtained when using the first gas can be obtained, the oxide film with the target film thickness ratio is formed by using the first gas and the second gas simultaneously, thereby forming the oxide film with the target film thickness ratio with an oxide film formed by the tetraethoxysilane and the nitrous oxide and an oxide film formed by the silane and the nitrous oxide.

* * * * *

UNITED STATES PATENT AND TRADEMARK OFFICE
CERTIFICATE OF CORRECTION

| | |
|---|---|
| PATENT NO. | : 8,598,049 B2 |
| APPLICATION NO. | : 13/517193 |
| DATED | : December 3, 2013 |
| INVENTOR(S) | : Masayasu Hatashita, Akimitsu Oishi and Soichi Murakami |

It is certified that error appears in the above-identified patent and that said Letters Patent is hereby corrected as shown below:

On the Title Page, Item (73) the Assignee should read:
"SPP Technologies Co., Ltd., Tokyo, JP"

Signed and Sealed this
Twenty-fourth Day of February, 2015

Michelle K. Lee
*Deputy Director of the United States Patent and Trademark Office*